United States Patent [19]

Holcomb et al.

[11] 4,009,450
[45] Feb. 22, 1977

[54] PHASE LOCKED LOOP TRACKING FILTER HAVING ENHANCED ATTENUATION OF UNWANTED SIGNALS

[75] Inventors: Don R. Holcomb, Phoenix; Arthur J. Kline, Jr., Scottsdale, both of Ariz.

[73] Assignee: Motorola, Inc., Chicago, Ill.

[22] Filed: Apr. 14, 1975

[21] Appl. No.: 568,073

[52] U.S. Cl. .................................. 331/17; 331/25
[51] Int. Cl.² ......................................... H03B 3/04
[58] Field of Search ...................... 331/17, 18, 25

[56] References Cited
UNITED STATES PATENTS

| | | | |
|---|---|---|---|
| 3,495,184 | 2/1970 | Perkins, Jr. et al. | 331/17 X |
| 3,624,511 | 11/1971 | Sui | 331/17 X |
| 3,740,671 | 6/1973 | Crow et al. | 331/25 X |
| 3,810,036 | 5/1974 | Bloedorn | 331/17 X |

*Primary Examiner*—Siegfried H. Grimm
*Attorney, Agent, or Firm*—Eugene A. Parsons; Harry M. Weiss

[57] ABSTRACT

In a tracking filter, which includes a conventional phase locked loop having a phase detector, a filter and a voltage controlled oscillator adapted to track a wanted signal and attenuate unwanted signals and noise from an incoming spectrum of signals, there is provided a phase modulator and an additional filter adapted to attenuate further the unwanted signals and the noise without degrading the ability of the loop to track the wanted signal.

2 Claims, 17 Drawing Figures

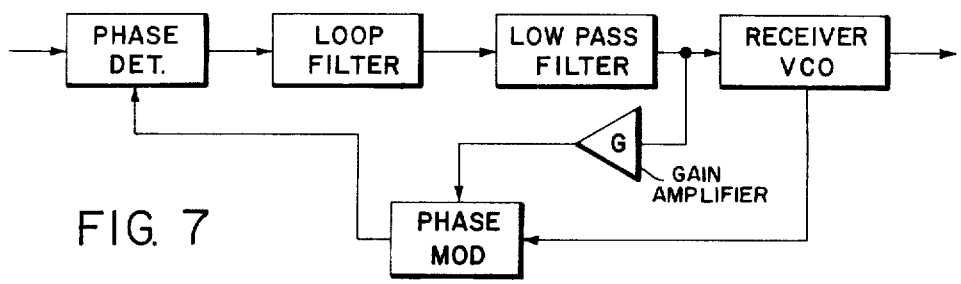
FIG. 7
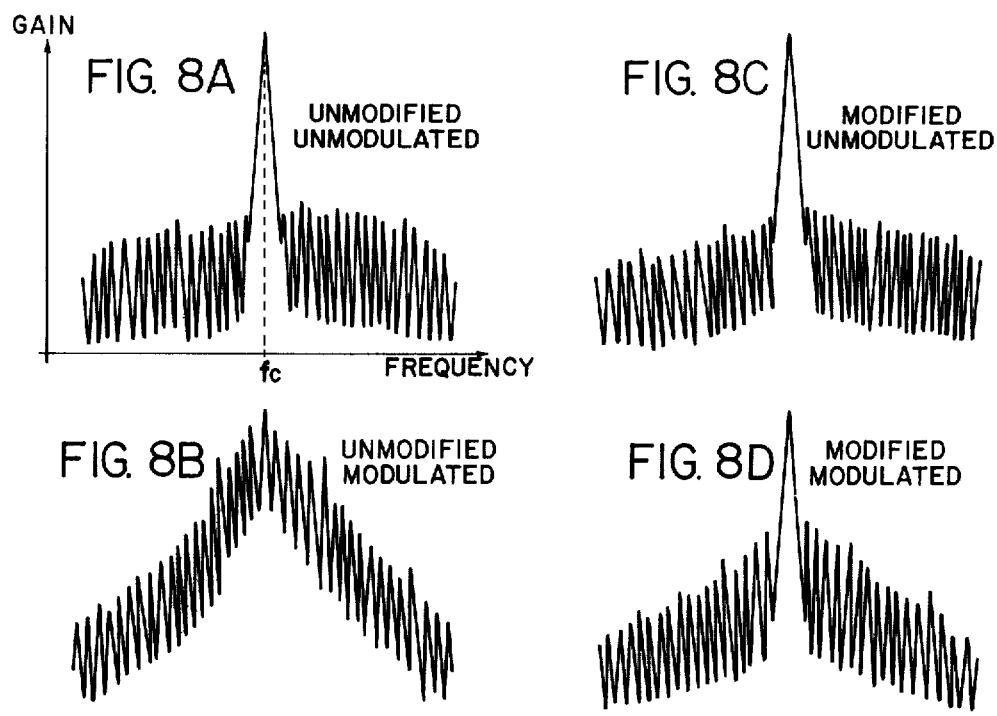
FIG. 8A UNMODIFIED UNMODULATED
FIG. 8C MODIFIED UNMODULATED
FIG. 8B UNMODIFIED MODULATED
FIG. 8D MODIFIED MODULATED
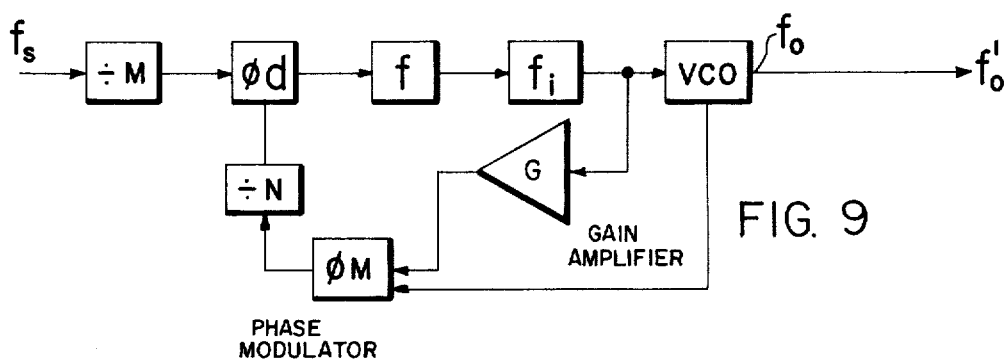
FIG. 9

PHASE LOCKED LOOP TRACKING FILTER HAVING ENHANCED ATTENUATION OF UNWANTED SIGNALS

FIELD OF THE INVENTION

This invention relates to a filter and, more particularly, to an improved tracking filter and use of the filter in a transmission system.

BACKGROUND OF THE INVENTION

Tracking filters are extensively used for tracking signals in communication systems where unwanted signals and the ambient noise content are high. For example, the signals in space communication systems are subject to wide dynamic changes of frequency and a high additive noise level and the receiver must be able to track the wanted signal embedded in the noise and unwanted signal spectrum. Usually, a transponder on board a space vehicle is provided with a tracking filter to track the high wanted signal from an incoming spectrum of signals having a high noise content and being subjected to a dynamic rate of change due to the Doppler effect, as it approaches and recedes from a ground transmitting station.

The signal used in such an environment is typically phase or frequency modulated and by the time it reaches the receiver, it is a narrow band signal which has undergone a wide shift of frequency due to the Doppler effect and is deeply imbedded in additive noise. For example, a modulated signal having a band width of 20 Hertz may undergo 200 KHertz shift due to the Doppler effect, and is also buried in or accompanied by a high ambient noise level. Heretofore, generally a receiver is provided with a tracking filter designed to track the signal of the aforementioned nature, and to extract the wanted signal. Typically, such a filter includes a phase locked loop having a phase detector, a filter, and an oscillator designed to track and recover the wanted signal and attenuate the unwanted signals and noise from the incoming signal spectrum. However, the attenuation is not complete because attempts to attenuate unwanted signal completely tended to cause the tracking filter to be unable to track the wanted components.

SUMMARY OF THE INVENTION

In accordance with the present invention, aforementioned shortcomings and problems have been overcome and substantial improvement is made to the performance capability of the tracking filter by providing an improved phase locked loop that attenuates the unwanted signal and noise further without degrading the tracking capability of the phase locked loop. This is acomplished by the use of an additional filter and a phase modulator of a predetermined nature operatively inserted in the phase locked loop that alters the transfer characteristics of the phase locked loop to further attenuate the unwanted signal portion and noise with no effect upon the capability of the loop to follow the wanted signal.

According to another aspect of the present invention, there is provided a transmission system which utilizes the enhanced tracking filter of the present invention in such a way that, with a minimum of additional circuits, the system receives and tracks a wanted signal of one characteristic and transmits a signal of another characteristic.

Advantageously, the improved tracking filter in accordance with the present invention bypasses high frequency components of the input signal around the VCO which avoids the usual difficulties due to limited VCO response and spurious responses.

The foregoing and other aspects of the present invention and the advantages thereof shall be more fully apprehended from the following detailed description of an illustrative embodiment of the present invention in conjunction with the accompanying drawings.

BRIEF DESCRIPTION OF THE DRAWINGS

FIGS. 6 and 7 show improved tracking filters according to the present invention.

FIGS. 8A, 8B, 8C and 8D illustrate the spectral responses of the filter before and after the improvement.

FIG. 9 shows a transmission system utilizing the improved tracking filter.

DETAILED DESCRIPTION

Figure 1:
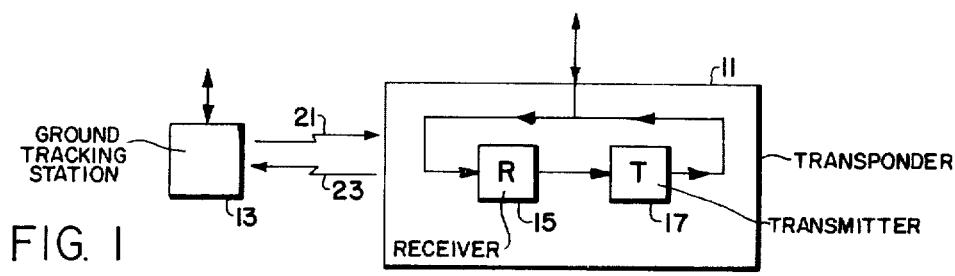
FIG. 1 shows a block diagram of a transmission system including a ground station and mobile vehicle having a transponder on board which illustrates the environment in which the improved tracking filter of the present invention may be advantageously used.

FIG. 1 illustrates an environment in which the function of the tracking filter of the present invention is advantageously utilized. For example, for telemetry and other purposes, a mobile vehicle, such as airborne satellite, may be equipped with a transponder 11 to communicate with other stations, such as a ground tracking station 13. The communication system is typically designed so that the ground station 13 monitors the approach and recession of the vehicle as it passes by the latter and commands the vehicle to perform certain functions and to transmit certain telemetry data to the ground station. The communication typically takes place in the form of the up-link and down-link modulations. Typically the up-link modulated signal 21 from the ground station to the transponder 11 is received by a receiver 15, and the transponder 11 may also be arranged to send down-link modulated signal 23 to the ground station via its transmitter 17.

A basic difficulty is encountered in such a system in that undesirable residual tracking of the up-link modulation in the phase locked loop causes a loss of the communication efficiency in both the up-link and down-link transmissions. This process is fundamental and occurs because the loop provides insufficient attenuation to the modulation on the received signal.

Figure 2:
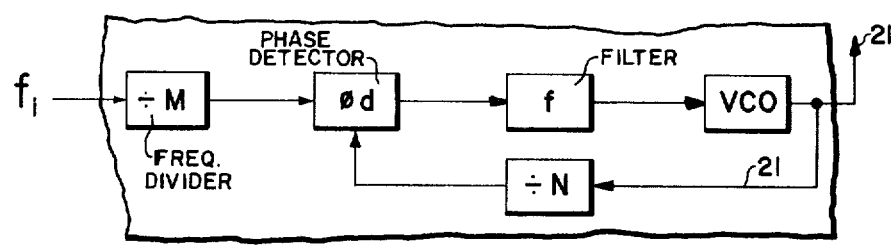
FIG. 2 shows a conventional tracking filter having a phase locked loop in a block diagram form.
Figure 3:
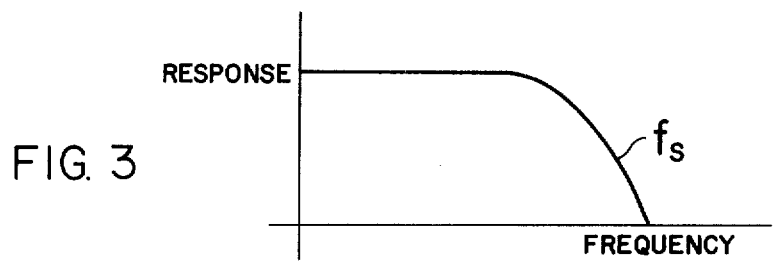
FIG. 3 shows a frequency response characteristic of the tracking filter illustrated in FIG. 2.

Referring to FIG. 2, it shows a conventional tracking filter which includes a phase locked loop having a frequency divider M, a phase detector $0d$, filter $f$, and voltage controlled oscillator (VCO) and a divider N typically connected in a loop as shown. The output of the VCO is fed back to the phase detector $0d$ through a feedback path 21, that provides frequency division N. The loop is generally designed to provide an output signal whose frequency, $f_o$, is related to that of the input, $f_i$, where $f_o = N/M f_i$, $M$ being the number dividing the input frequency and $N$ being the divider in the feedback path. The phase locked loop is designed so that it predicts what the incoming signal will be by the process of correlation or comparison. It is designed to try to track the latest changes in the received signal and ignore any voltages such as noise or unwanted signals in which the wanted signal is embedded. In short, the phase locked loop has a transfer characteristic that permits the tracking filter to recover the wanted signal $f_i$ and develop another signal $f_o$. An insight into the aforementioned dynamic nature of the signal being tracked and the transfer characteristics of the phase locked loop may be also gained in another way in conjunction with the frequency spectrum shown in FIGS. 4A–4F.

Figure 4A:
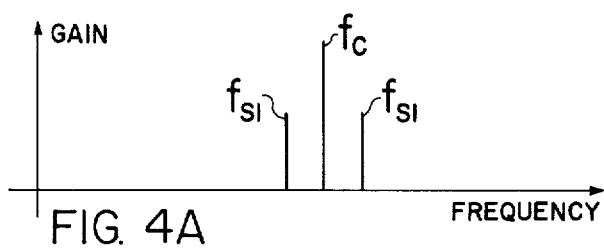
FIGS. 4A–4F show the spectrum distribution and response characteristics of the tracking filter.

Generally, as shown in FIG. 4A, it is known that, with a small index of modulation, the carrier wave, $f_c$, has a high energy content and side band signals or harmonics or subcarriers $f_{s1}$ and $f'_{s1}$ are of relatively lower energy level. With increasing modulation index, the carrier frequency energy becomes smaller and the subcarrier energy larger. With larger index of modulation, also larger number of harmonics appear, namely, $f_{s2}, f_{s3}, f_{s4}$, - - - $f'_{s2}, f'_{s3}$ . . . , as illustrated in FIGS. 4B and 4C. This goes on until the index of modulation reaches 2.402 where the carrier may be completely suppressed.

As is generally known, complete suppression of the carrier, $f_c$, is avoided because in its absence, the phase locked loop has nothing to track. So a sort of compromise is usually made whereby the modulation index is selected that provides relatively high subcarrier energy and an adequate carrier level, as illustrated in FIG. 4C.

Figure 4D:
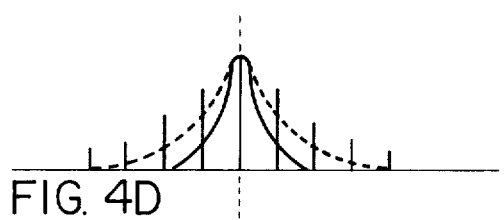
Figure 4B:
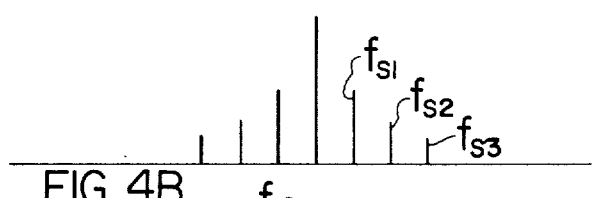
Figure 4E:
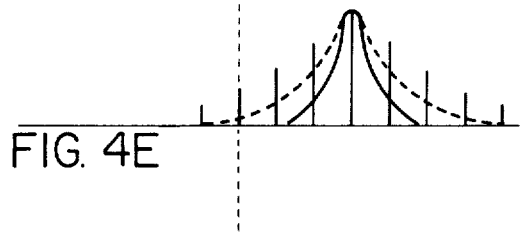
Figure 4C:
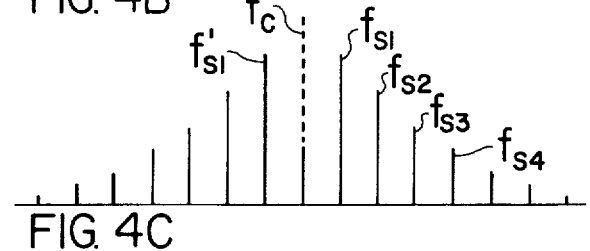
Figure 4F:
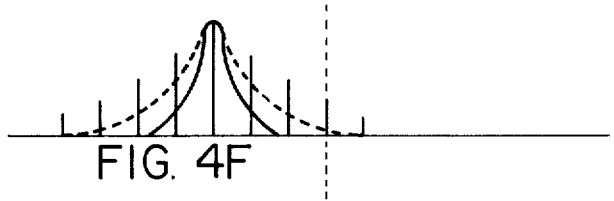
Figure 5:
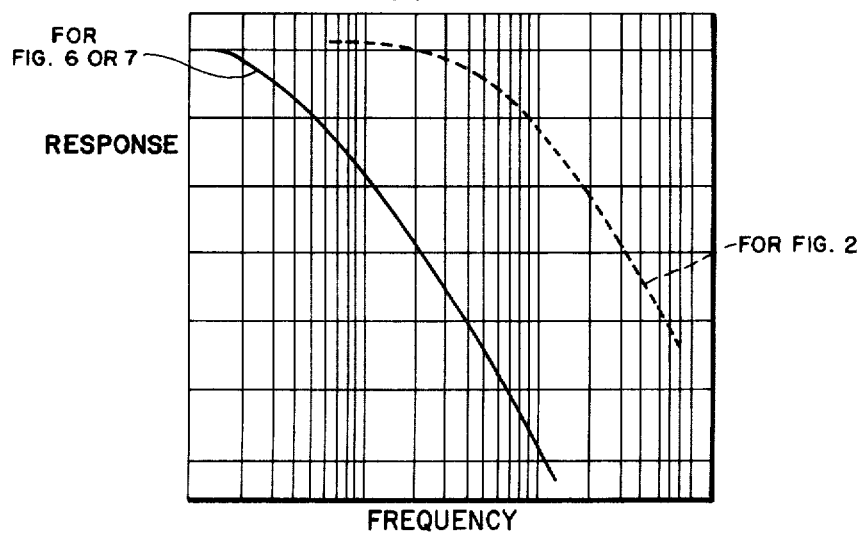
FIG. 5 illustrates the signal loop response characteristics of the phase locked loop helpful in the understanding of the operation of the tracking filter of FIGS. 2 and 6.

The conventional tracking filter is designed also to track the carrier where the carrier as well as a whole spectrum of harmonics or subcarriers, shift upwardly in frequency as shown in FIG. 4E, or downwardly as shown in FIG. 4F, relative to the static spectrum shown in FIG. 4D.

Dotted lines in FIGS. 4D, 4E, 4F and 5, show the response characteristics of the conventional tracking filter shown in FIG. 2. Note that the spectrum response is such that the output of the tracking filter retains a relatively high portion of the received modulation $f_{s2}$, $f_{s3}$, etc., and the received noise surrounding in the spectrum.

Figure 6:
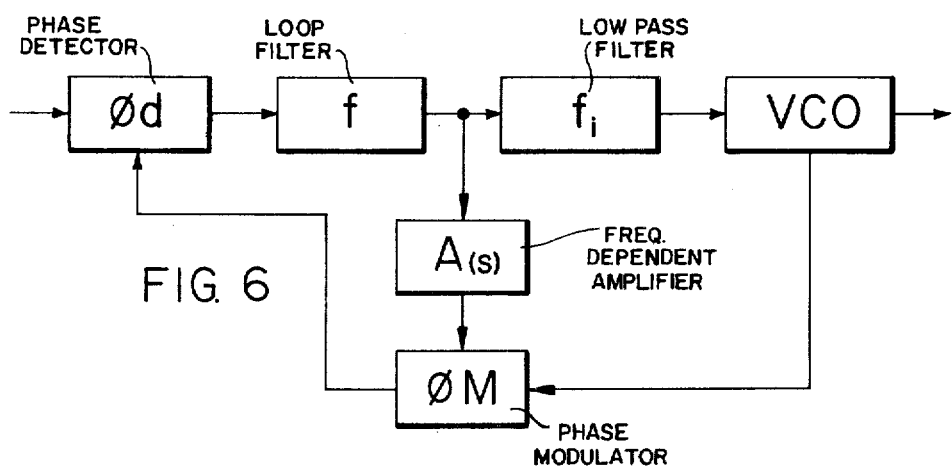

In accordance with the present invention, additional means are provided in the phase locked tracking loop so that the modified loop further attenuates subcarriers and surrounding noise without degrading the tracking ability. The improved response characteristics are illustrated in solid curves in FIGS. 4D, 4E, 4F and 5. This is achieved by using an additional low pass filter, $f_i$, and a phase modulator 0M, and a frequency dependent amplifier, A(s), operatively connected, as illustrated in FIG. 6. The low pass filter $f_i$, the frequency dependent amplifier A(s) and the phase modulator 0M may be of any suitable type conventionally available; their circuit parameters are scaled so that their effects are cancelled in the feedback path to the phase detector, yet the improved loop response characteristics as illustrated in solid lines in FIGS. 4D, 4E, 4F and 5 are present at the VCO output. This scaling, or the relationships of the VCO sensitivity, the modulator sensitivity and the time constant of the low pass filter is readily accomplished by application of Laplace transfer theory and results in requiring that the effective modulator sensitivity be the product of the VCO sensitivity and the time constant of the low pass filter, and the amplifier frequency dependence is equal to that of the low pass filter.

FIG. 7 illustrates another variation of the enhanced tracking circuitry which is a further modification of a tracking filter of the enhanced design shown in FIG. 6. According to this modification instead of a frequency dependent amplifier, an amplifier which merely provides just a gain is interposed between the output of the low pass filter and the phase modulator.

FIGS. 8A–8D show graphically the enhancement the present improved tracking filter provides in attenuating the unwanted signals or subcarriers and the noise signal in which the desired carrier signal is embedded. FIGS. 8A and 8B show the frequency spectrum response characteristics of the tracking filter before modification for the unmodulated up-link transmission (FIG. 8A) and modulated up-link transmission (FIG. 8B). FIGS. 8C and 8D show respectively, the frequency response characteristics of the tracking filter for the unmodulated up-link transmission (FIG. 8C) and modulated up-link transmission (FIG. 8D) after its modification. As evident from the comparison of FIG. 8D to FIG. 8B, substantial enhancement is attained by the present improved filter is attenuating the undesired spectrum of signals including subcarrier higher harmonics. The spectra shown are plotted logarithmically, the improvement being in this case a factor of one hundred times.

In accordance with another aspect of the present invention, the improved tracking filter described above in conjunction with FIGS. 6 and 7 may be utilized in a transmission system for tracking a desired signal from the incoming signal and transmitting an output signal $f_o'$ related to the incoming signal in a certain manner. This is illustrated in FIG. 9. Thus, specifically the incoming signal $f_s$ may include a spectrum of subcarriers as well as noise signals in which the carrier signal is embedded. The incoming signal of a desired nature such as first subcarrier $f_{s1}$ may be tracked and recovered utilizing the enhanced tracking filter. The output of the oscillator VCO is then used to transmit an output signal. Such an output signal may be utilized for the telemetry or other similar purposes, as extensively practiced in space communication systems. Various other changes and modifications will be apparent to those of ordinary skill without departing from the spirit and scope of the present invention.

What is claimed is:

1. A tracking filter for tracking a signal of a certain characteristic embedded in a spectrum of unwanted signals and noise, comprising:
    a phase locked loop having a phase detector, a loop filter and an oscillator configured for tracking the wanted signal and attenuating the unwanted signals and noise, and enhancing means including a low pass filter interposed between the loop filter and said oscillator, a phase modulator interposed between said oscillator and said phase detector and a frequency dependent amplifier interposed between the output of the loop filter and said phase modulator, wherein said low pass filter, said modulator and said amplifier are scaled to cancel the effect of each other out in the loop while providing the additional filtering action to the loop output.

2. A tracking filter for tracking a signal of a certain characteristic embedded in a spectrum of unwanted signals and noise, comprising:

a phase locked loop having a phase detector, a loop filter and an oscillator configured for tracking the wanted signal and attenuating the unwanted signals and noise, and enhancing means including a low pass filter interposed between the loop filter and said oscillator, a phase modulator interposed between the oscillator and said phase detector and a frequency independent amplifier interposed between the output of said low pass filter and said phase modulator wherein, said low pass filter, said modulator and said amplifier are scaled to cancel the effect of each other out in the loop while providing the additional filtering action to the loop output.

* * * * *